INVENTOR
MELVIN H. POSTON
BY [signature]
[signature]
ATTYS

United States Patent Office 3,302,041

Patented Jan. 31, 1967

3,302,041

SILICON CONTROL RECTIFIER AND FIELD EFFECT TRANSISTOR PULSE GENERATOR

Melvin H. Poston, Annapolis, Md., assignor, by mesne assignments, to the United States of America as represented by the Secretary of the Navy Filed Apr. 27, 1964, Ser. No. 363,029
4 Claims. (Cl. 307—88.5)

The present invention relates to a pulse generator and more particularly to a triggered pulse generator utilizing a silicon control rectifier.

The desirability of generating pulses having sharp rise and fall time has been established. However, the prior art pulse generators generally require a larger number of components consuming larger amounts of power. Alternatively, the prior art generators having a few components generally do not have the desired constant output impedance.

An object of the present invention is to provide a pulse generator which dissipates a small amount of power.

A further object of the invention is to provide a pulse generating circuit having a constant impedance while conserving the power provided by a power source.

Another object of the invention is to provide a silicon control rectifier pulse generator having a sharp rise and fall time.

Other objects and many of the attendant advantages of this invention will be readily appreciated as the same becomes better understood by reference to the following detailed description when considered in connection with the accompanying drawings wherein.

Figure 1:
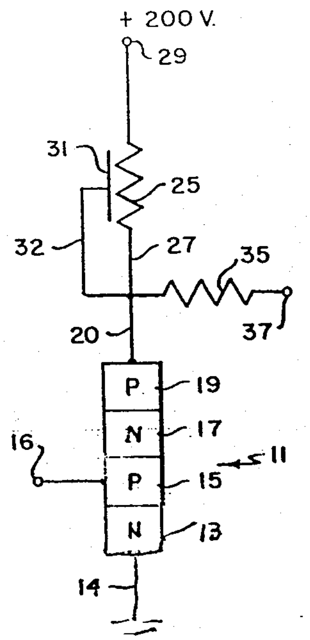
FIG. 1 is a circuit diagram of pulse generator embodying the instant invention.

Referring to FIG. 1 a silicon controlled rectifier 11 is provided with an emitter zone 13 of N type material having an electrode 14, a base or gate zone 15, having an electrode 16, a floating zone 17 and a collector zone 19, having an electrode 20. A semiconductor filament 25 using field effect modulation is sometimes called a fieldistor by those skilled in the art. Suitable fieldistors for use in the preferred embodiment of the invention are disclosed in the Wallmark Patent 2,900,531 and the Forman Patent 2,935,624. However, any semiconductor filament or equivalent using field effect modulation may be utilized. Lead 27 of the semiconductor filament 25 is connected to the connector electrode of the silicon controlled rectifier 11 and lead 29 of the semiconductor filament is connected to a source of B+ of 200 volts. A field modulating plate 31 is connected by lead 32 to the collector electrode 20 of the silicon controlled rectifier 11. A resistor 35 is connected between the collector electrode 20 of the silicon controlled rectifier 11 to an output terminal 37.

Figure 2:
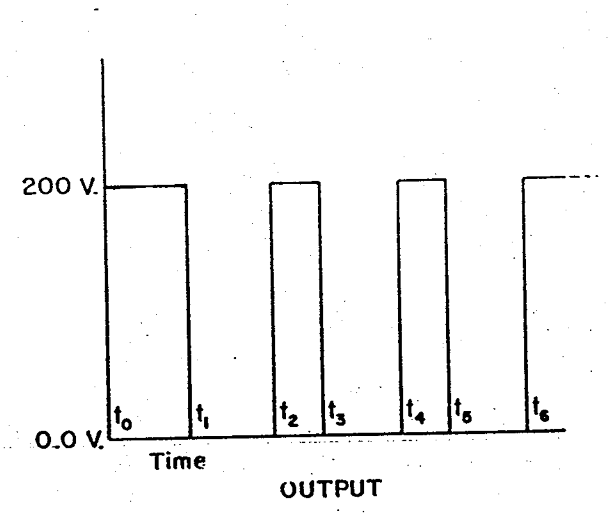
FIG. 2 is a diagram illustrating the voltage present on the output terminal of the instant pulse generator.
Figure 3:
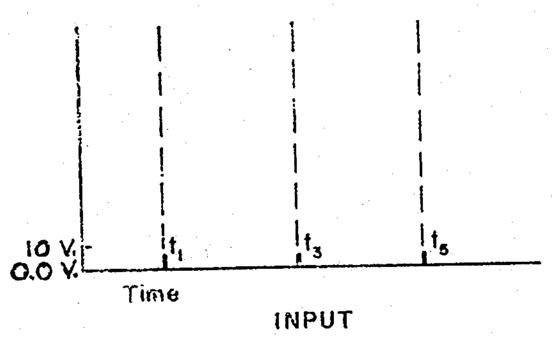
FIG. 3 is a diagram illustrating the sequence of trigger pulse applied to the input of the pulse generator of the present invention.

The operation of FIG. 1 will be discussed with reference to the time sequence of pulses illustrated in FIGS. 2 and 3. When the silicon controlled rectifier 17 is in its high resistance state, at a time $t_0$, then the leakage current through the silicon controlled rectifier is less than the pinch off current level of the semiconductor filament 25 leaving the semiconductor filament 25 in its low resistance state. At time $t_1$ a positive pulse is supplied to the electrode 16, gating the silicon controlled rectifier thereby placing the silicon controlled rectifier 11 in its low resistance condition. When the silicon controlled rectifier is in its low resistance condition then the collector electrode 20 is substantially at ground potential causing the semiconductor filament 25 to become pinched off into its high resistance region. Enough current flows through the semiconductor filament 25 in its high resistance state to sustain conduction in the silicon controlled rectifier 11 for a short period of time as shown by FIG. 2 of the drawing. A suitable theory of operation of the silicon controlled rectifier for generating the pulse between times $t_1$ and $t_2$, $t_3$ and $t_4$, $t_5$ and $t_6$ etc. is as follows: The positive turn on pulse, of short duration as shown by FIG. 3 of the drawing, supplied to the base zone 15 of the silicon controlled rectifier 11, for example, injects holes into the base zone 15 which initiate conduction of silicon controlled rectifier 11, which will be maintained for a predetermined interval of time after pinch off of the field effect transistor until all the holes are dissipated either by diffusion, or migration or by recombination with electrons. During this period of time the silicon controlled rectifier 11 remains in its conductive state.

These injected holes will exist for a certain length of time which depends on the geometry of the silicon controlled rectifier 11 and properties of the material of the base zone 15. At time $t_2$ all of the holes injected into the base zone 15 will have been dissipated causing the silicon controlled rectifier 11 to return to its high resistance state reducing the current flowing through the semiconductor filament causing the semiconductor filament 25 to return to its low resistance state. The process described above is repetitive with each input pulse placed on the input terminal 16.

Obviously many modifications and variations of the present invention are possible in the light of the above teachings. It is therefore to be understood that within the scope of the appended claims the invention may be practiced otherwise than as specifically described.

What is claimed is:

1. A constant output impedance triggered pulse generator comprising:

a silicon control rectifier means having an input and an output; and a field effect modulated semiconductor means having a first terminal for connection to a voltage source, a second terminal and a field modulating input, said second terminal and said field modulating input being connected to said output of said first semiconductor whereby an input pulse placed on the input terminal of said first semiconductor causes an output pulse to appear on the output terminal of said first semiconductor.

2. A constant output impedance triggered pulse generator as defined in claim 1 but further characterized by having an output terminal; and an impedance connected between said output of said silicon control rectifier and said output terminal.

3. A constant output impedance triggered pulse generator as defined in claim 2 but further characterized by said field effect modulated semiconductor means comprises a fieldistor.

4. A constant output impedance triggered pulse generator as defined in claim 1 but further characterized by said field effect modulated semiconductor means comprises a fieldistor.

References Cited by the Examiner

UNITED STATES PATENTS

| | | | |
|---|---|---|---|
| 3,018,392 | 1/1962 | Jones et al. | 307—88.5 |
| 3,079,514 | 2/1963 | Fischman | 307—88.5 |
| 3,135,926 | 6/1964 | Bockemuehl | 317—235 |

OTHER REFERENCES

RCA Technical Notes, TN No. 454, September 1961 (copy in Gr. 250 330–38 FE).

ARTHUR GAUSS, *Primary Examiner.*

J. HEYMAN, *Assistant Examiner.*